US009019023B2

(12) United States Patent
Yorita

(10) Patent No.: US 9,019,023 B2
(45) Date of Patent: *Apr. 28, 2015

(54) OSCILLATOR

(71) Applicant: Nihon Dempa Kogyo Co., Ltd., Tokyo (JP)

(72) Inventor: Tomoya Yorita, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 72 days.

This patent is subject to a terminal disclaimer.

(21) Appl. No.: 13/872,170

(22) Filed: Apr. 29, 2013

(65) Prior Publication Data

US 2013/0293312 A1 Nov. 7, 2013

(30) Foreign Application Priority Data

May 1, 2012 (JP) ................................. 2012-104726

(51) Int. Cl.
*H03L 1/02* (2006.01)
*H03K 3/011* (2006.01)

(52) U.S. Cl.
CPC ........ *H03L 1/02* (2013.01); *H03K 3/011* (2013.01); *H03L 1/022* (2013.01)

(58) Field of Classification Search
CPC ....................................................... H03L 1/02
USPC ................... 331/70, 116 R, 116 FE, 158, 176
See application file for complete search history.

(56) References Cited

U.S. PATENT DOCUMENTS

| 4,537,515 | A  | * | 8/1985  | Dinger et al. ................. 368/202 |
| 5,574,408 | A  | * | 11/1996 | Zwack .......................... 331/176 |
| 6,236,282 | B1 | * | 5/2001  | Ballantyne et al. ........... 331/158 |
| 6,545,550 | B1 | * | 4/2003  | Frerking ......................... 331/44 |
| 7,541,878 | B2 | * | 6/2009  | Haiut ................................ 331/2 |
| 8,321,169 | B2 | * | 11/2012 | Brooks et al. .................. 702/99 |

FOREIGN PATENT DOCUMENTS

| JP | 2001-292030 | 10/2001 |
| JP | 2011-135342 | 7/2011 |
| JP | 2011-188373 | 9/2011 |
| JP | 2012-095284 | 5/2012 |
| JP | 2012-170050 | 9/2012 |

* cited by examiner

*Primary Examiner* — Joseph Chang
*Assistant Examiner* — Jeffrey Shin
(74) *Attorney, Agent, or Firm* — Jianq Chyun IP Office

(57) ABSTRACT

An oscillator outputs a control signal to suppress an influence caused by temperature characteristic of f1 based on a differential signal corresponding to difference between an oscillation output f1 of a first oscillator circuit and an oscillation output f2 of a second oscillator circuit treated as a temperature detection value. A switching unit switches between a first state and a second state. The first state is a state where a first connecting end and a second connecting end are connected to a storage unit for access from an external computer to the storage unit. The second state is a state where the first connecting end and the second connecting end are connected to a first signal path and a second signal path such that the respective f1 and f2 are retrieved from the first connecting end and the second connecting end to an external frequency measuring unit.

5 Claims, 18 Drawing Sheets

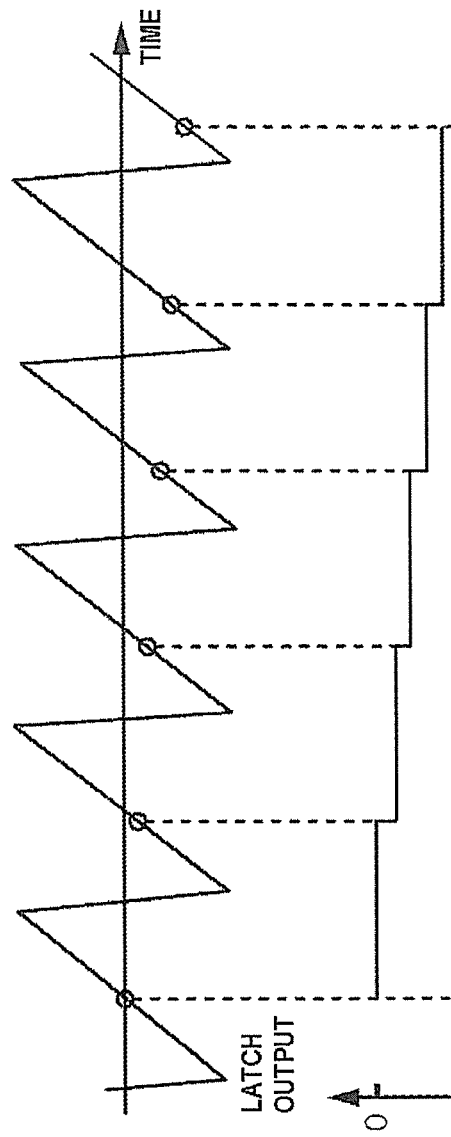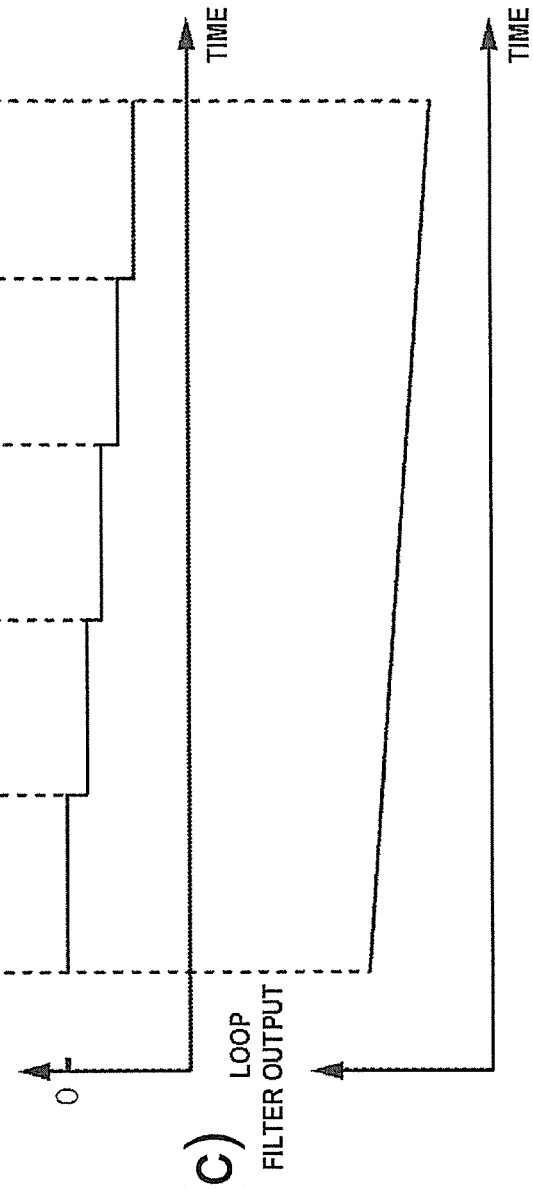
FIG. 4(a) DDS OUTPUT, LATCH POINT
FIG. 4(b) LATCH OUTPUT
FIG. 4(c) LOOP FILTER OUTPUT

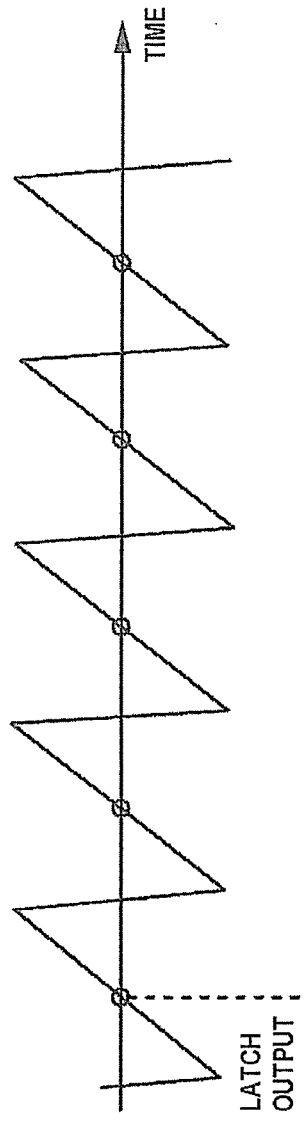
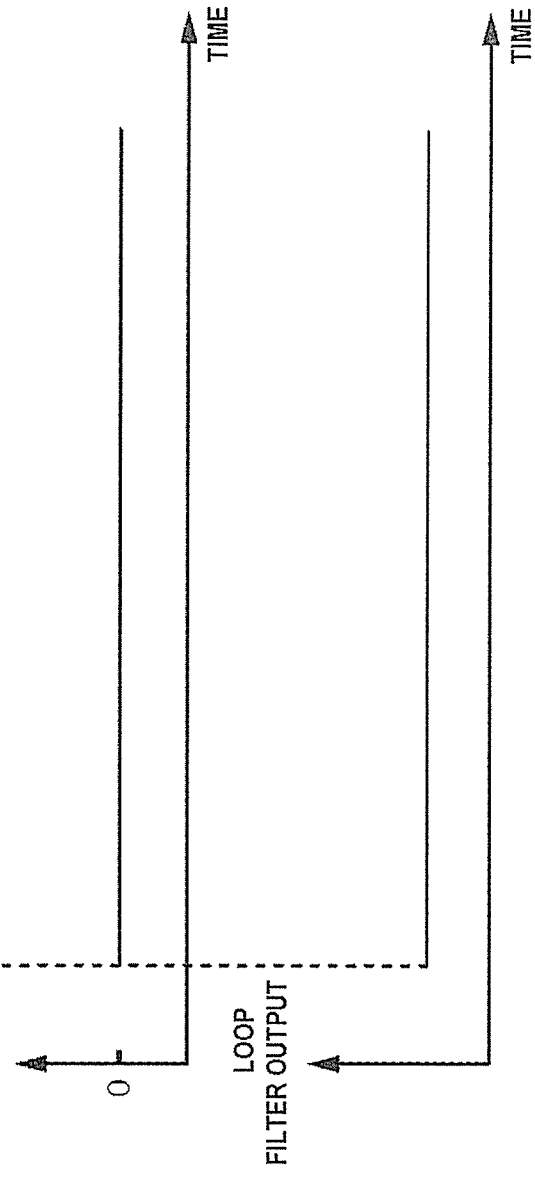
FIG. 5(a)
FIG. 5(b)
FIG. 5(c)

OSCILLATOR

CROSS REFERENCE TO RELATED APPLICATIONS

This application claims the priority benefit of Japan application serial no. 2012-104726, filed on May 1, 2012. The entirety of the above-mentioned patent application is hereby incorporated by reference herein and made a part of this specification.

TECHNICAL FIELD

This present disclosure relates to an oscillator where a signal corresponding to a difference between an oscillation output f1 of a first oscillator circuit and an oscillation output f2 of a second oscillator circuit is treated as a temperature detection value and reduces an influence caused by temperature characteristic of f1.

DESCRIPTION OF THE RELATED ART

FIG. 18 illustrates a general constitution of Temperature Compensated Crystal Oscillator (TCXO), which is an oscillator. Reference numeral 90 denotes a crystal unit, and reference numeral 91 denotes an oscillator circuit. Changing a control voltage supplied from a control voltage generator 93 to a voltage variable capacitance element 92 controls a capacitance of the voltage variable capacitance element 92 so as to adjust an oscillation frequency (an output frequency).

Since a frequency of a crystal unit 90 changes according to temperature, the control voltage generator 93 corrects a control voltage according to temperature detected by a temperature sensor 94. Specifically, for example, a cubic function, which is a function where frequency versus temperature characteristic of the crystal unit 90 is normalized at a reference temperature, is stored in a memory 95. Then, a frequency corresponding to a temperature detection value is read out based on this function (frequency versus temperature characteristic). That is, how much a frequency at temperature at the moment deviates relative to a frequency at the reference temperature is read. A control voltage corresponding to the amount of deviation in frequency is regarded as a temperature compensation amount. Then, the temperature compensation amount is subtracted from a control voltage corresponding to the frequency at the reference temperature. As well as an example described here, the details will be described in this embodiment, by treating a signal corresponding to a difference between an oscillation output f1 of a first oscillator circuit and an oscillation output f2 of a second oscillator circuit as a temperature detection value, employing an oscillator that obtains an even more precise output is examined.

Meanwhile, the oscillator needs to be adjusted to obtain a stable oscillation output. In an example where the TCXO is employed, a function to determine a control voltage corresponding to the above-described temperature detection value is set. However, to perform this adjustment, for example, a device or similar that measures a frequency for adjustment is connectable. There is a need for a simplified configuration of the oscillator.

FIG. 2 and FIG. 3 of Japanese Unexamined Patent Application Publication No. 2001-292030 disclose two pairs of electrodes that are disposed at a common crystal element to form two crystal units (crystal resonators). The paragraph 0018 describes a frequency difference that occurs between the two crystal units according to a temperature change. It is disclosed that measuring this frequency difference is the same as measuring the temperature. The relationship between this frequency difference $\Delta f$ and the frequency amount to be corrected is stored in ROM, and a frequency correction amount is read based on $\Delta f$. However, this apparatus cannot solve the above-described problem.

The present disclosure has been made under these circumstances, and this disclosure is to provide an oscillator that outputs a control signal to reduce an influence caused by a temperature characteristic at high accuracy and an oscillator where the constitution can be simplified.

SUMMARY

An oscillator according to the present disclosure is an oscillator for outputting f1 as an oscillation output by treating a differential signal corresponding to a difference between an oscillation output f1 of a first oscillator circuit and an oscillation output f2 of a second oscillator circuit as a temperature detection value. The oscillator outputs a control signal to suppress an influence caused by a temperature characteristic of f1 based on the differential signal. The oscillator includes a storage unit, a signal processing unit, a first connecting end and a second connecting end, and a switching unit. The storage unit stores a parameter to output the control signal. The signal processing unit is connected to a first signal path and a second signal path to retrieve the respective f1 and f2. The signal processing unit obtains the differential signal from the retrieved f1 and f2. The signal processing unit outputs the control signal based on the differential signal and the parameter. The first connecting end and the second connecting end are to be connected to an external computer. The switching unit switches between a first state and a second state. The first state is a state where the first connecting end and the second connecting end are connected to the storage unit for access from the external computer to the storage unit. The second state is a state where the first connecting end and the second connecting end are connected to the first signal path and the second signal path such that the respective f1 and f2 are retrieved from the first connecting end and the second connecting end to an external frequency measuring unit.

Specific aspects of the present disclosure are, for example, as follows.

(1) In a second aspect of the disclosure, the switching unit switches the first state and the second state based on a logical value stored in a storage area for switching a connection state disposed in the memory. In the storage area for switching, one of a first logical value for switching the switching unit in the first state and a second logical value for switching the switching unit in the second state is selected and stored. A reset unit is disposed independently of the external computer. The reset unit resets a logical value in the storage area for switching to the first logical value.

(2) In the oscillator according to the second aspect, the reset unit resets a logical value storage area to the first logical value when a power source of the oscillator is turned on.

(3) In the oscillator, a control signal to suppress an influence caused by a temperature characteristic of f1 is a signal corresponding to a frequency correction value relative to f1 at a reference temperature. The signal is based on a relationship between variation amount of f1 from a value of f1 at the reference temperature and a signal corresponding to a difference between f1 and f2.

(4) The oscillator includes a heat regulation unit configured to maintain a constant temperature of a first crystal unit and a second crystal unit. The first crystal unit and the second crystal unit are connected to the first oscillator circuit and the second oscillator circuit. A control signal is configured to suppress an influence caused by a temperature characteristic of f1. The control signal is a signal for controlling an amount of heat generated by the heat regulation unit.

The oscillator according to the present disclosure is configured to output a control signal that suppresses an influence caused by a temperature characteristic of f1 based on a differential signal corresponding to a difference between an oscillation output f1 of a first oscillator circuit and an oscillation output f2 of a second oscillator circuit. The oscillator switches between a state where a first connecting end and a second connecting end, which are connected to an external computer, are connected to a storage unit and a state where the first connecting end and the second connecting end are connected to signal paths, which supply f1 and f2 to the signal processing unit. The storage unit stores a parameter employed by a signal processing unit that outputs the control signal. This allows reduction of frequency variation due to temperature at high accuracy. Further, this eliminates the need for a dedicated terminal for retrieving the f1 and f2. Accordingly, the constitution of the apparatus can be simplified.

BRIEF DESCRIPTION OF THE DRAWINGS

FIG. 4(a) to FIG. 4(c) are waveform diagrams of each portion schematically illustrating a state where a loop including a DDS circuit unit illustrated in FIG. 2 is not locked;

FIG. 5(a) to FIG. 5(c) are waveform diagrams of each portion schematically illustrating a state where a loop including a DDS circuit unit illustrated in FIG. 2 is locked;

DETAILED DESCRIPTION

Figure 1:
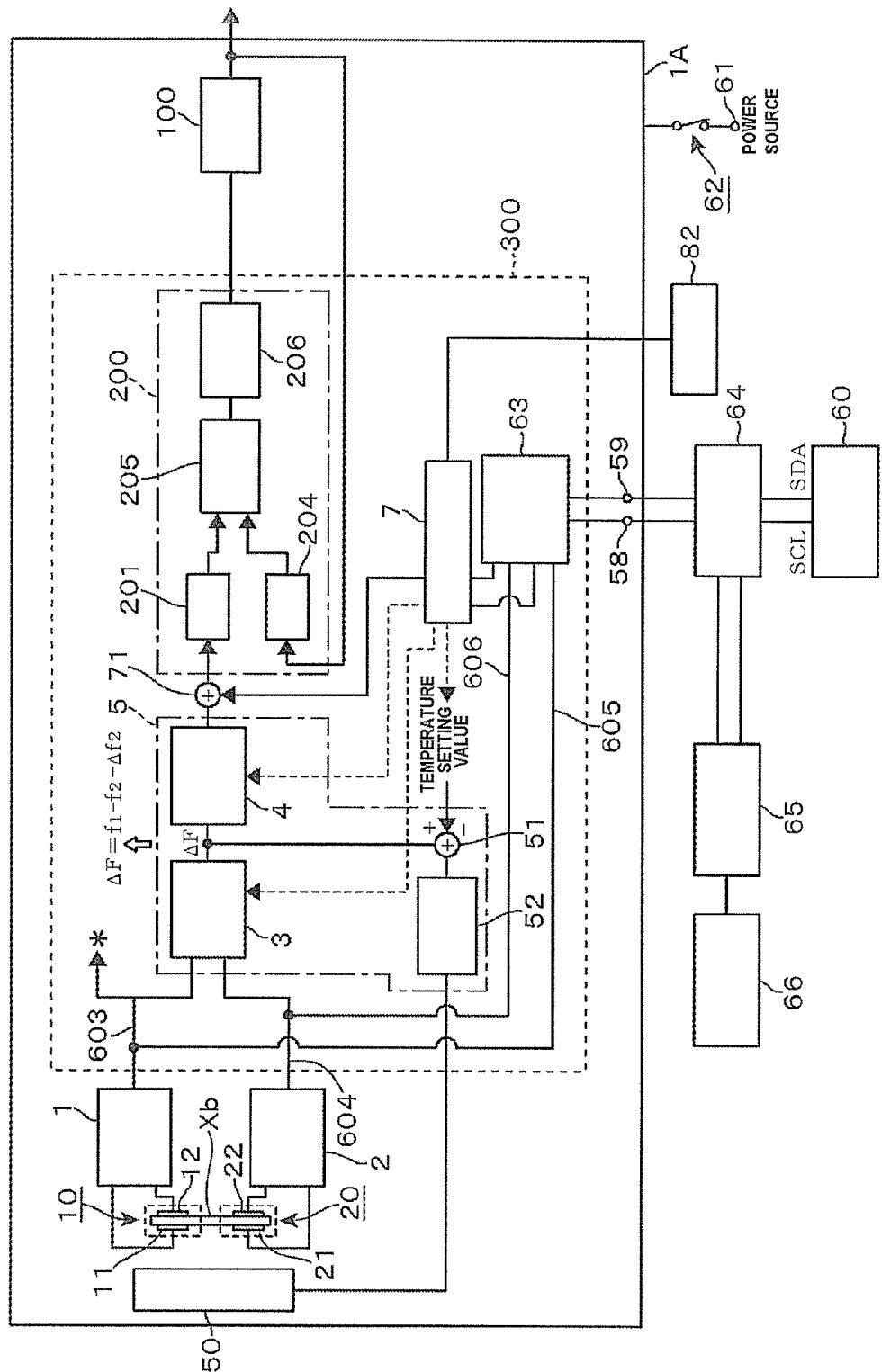
FIG. 1 is a block diagram illustrating an overall configuration of an oscillator according to the present disclosure.

FIG. 1 is a block diagram illustrating an entire oscillator 1A constituted by applying a crystal controlled oscillator according to an embodiment of the present disclosure. This oscillator 1A is constituted as a frequency synthesizer that outputs a frequency signal at a set frequency. The oscillator 1A includes a voltage control oscillator 100 employing a crystal unit, a control circuit unit 200, which constitutes PLL for the voltage control oscillator 100, a crystal controlled oscillator (a reference numeral is not given), and a heater circuit 50. The crystal controlled oscillator generates a clock signal to operate a DDS circuit unit 201 that generates a reference signal of the PLL. The heater circuit 50 adjusts temperature of atmosphere around crystal units 10 and 20 in this crystal controlled oscillator. Hence, the crystal controlled oscillator is Oven-Controlled Crystal Oscillators (OCXO).

The control circuit unit 200 is PLL (Phase locked loop). The control circuit unit 200 compares a reference clock (for reference) with a phase of a clock of a phase frequency comparator 205. The reference clock (for reference) is output from a DDS (Direct Digital Synthesizer) circuit unit 201. The phase of a clock is formed by dividing an output of the voltage control oscillator 100 by a divider 204. A phase difference, which is a result of the comparison, is converted into an analog signal by a charge pump 206. The analog signal is input to a loop filter and controlled to stabilize the PLL. The DDS circuit unit 201 employs a frequency signal output from a first oscillator circuit 1, which will be described below, as a reference clock. Frequency data (a digital value) to output a signal of a target frequency is input to the DDS circuit unit 201.

However, a frequency of the reference clock has a temperature characteristic. To offset the temperature characteristic, a signal corresponding to a frequency correction value, which will be described below, is added to the frequency data to be input to the DDS circuit unit 201. Correcting the frequency data to be input to the DDS circuit unit 201 offsets the temperature variation amount of an output frequency of the DDS circuit unit 201 based on the amount of temperature characteristic variation of the reference clock. As a result, a frequency of the reference clock is stable with respect to the temperature change. Accordingly, an output frequency from the voltage control oscillator 100 is stabilized. That is, the crystal controlled oscillator is also constituted as a TCXO. So to speak, the oscillator 1A configured with dual temperature control is an apparatus that can stabilize an output with high accuracy.

The crystal controlled oscillator includes the first crystal unit 10 and the second crystal unit 20, which are constituted using a common crystal element Xb. For example, a region of the strip-shaped crystal element Xb is divided into two regions in the longitudinal direction to form electrodes for excitation on both front and back surfaces of each divided region (a vibrating region). Then, the first crystal unit 10 is formed of one divided region and a pair of electrodes 11 and 12. Also, the second crystal unit 20 is formed of the other divided region and a pair of electrodes 21 and 22.

A first oscillator circuit 1 and a second oscillator circuit 2 are respectively connected to the first crystal unit 10 and second crystal unit 20. Here, for convenience, it is assumed that a frequency signal of the frequency f1 is output from the first oscillator circuit 1 while a frequency signal of the frequency f2 is output from the second oscillator circuit 2. The frequency signal of the frequency f1 is supplied to the control circuit unit 200 as the reference clock.

Reference numeral 3 denotes a frequency difference detector. A frequency difference detector 3 is, to say schematically, a circuit unit to retrieve f2−f1−Δfr, which is a difference between Mr and a difference between f1 and f2. Δfr is a difference between f1 (f1r) and f2 (f2r) at the reference temperature, for example, 25° C. One exemplary difference between f1 and f2 is, for example, several MHz. The present disclosure is met by calculating ΔF, which is a difference between a value corresponding to a difference between f1 and f2 and a value corresponding to a difference between f1 and f2 at the reference temperature, for example, 25° C. retrieved by the frequency difference detector 3. To be more specific, a value that can be obtained in the frequency difference detector 3 is {(f2−f1)/f1}−{(f2r−f1r)/f1r}.

Figure 2:
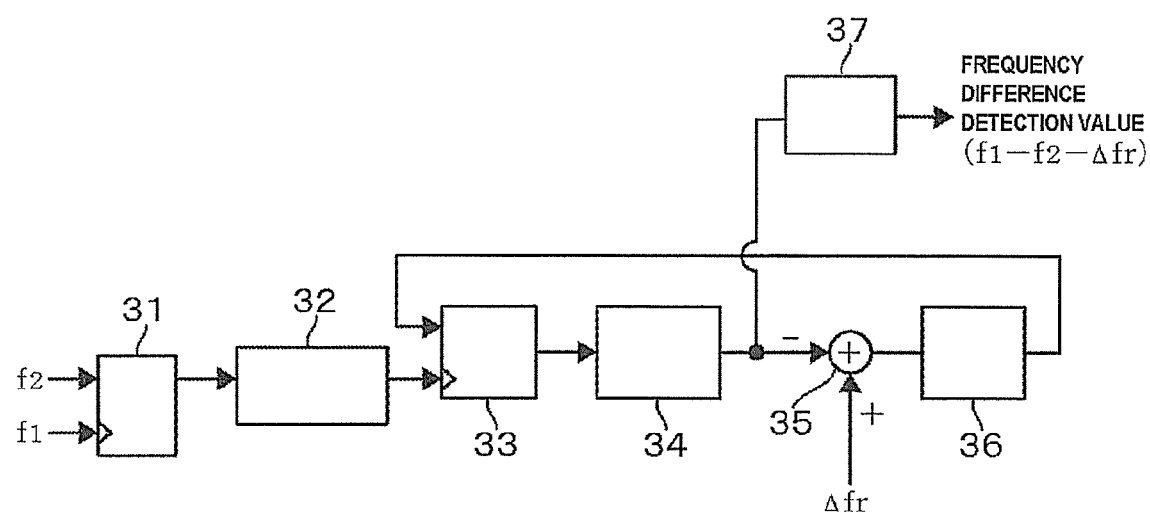
FIG. 2 is a block diagram illustrating a part of the oscillator.

FIG. 2 illustrates a concrete example of the frequency difference detector 3. Reference numeral 31 denotes a flip-flop circuit (a F/F circuit). The frequency signal of the frequency f1 is input from the first oscillator circuit 1 to one input port of a flip-flop circuit 31. The frequency signal of the frequency f2 is input from the second oscillator circuit 2 to the other input port of the flip-flop circuit 31. The frequency signal of the frequency f2 from the second oscillator circuit 2 is latched with the frequency signal of the frequency f1 from the first oscillator circuit 1. To avoid redundancy of description, hereinafter f1 and f2 are treated as representing a frequency or the frequency signal itself. The flip-flop circuit 31 outputs a signal of a frequency (f2−f1)/f1, which is a value corresponding to a frequency difference between f1 and f2.

Figure 3:
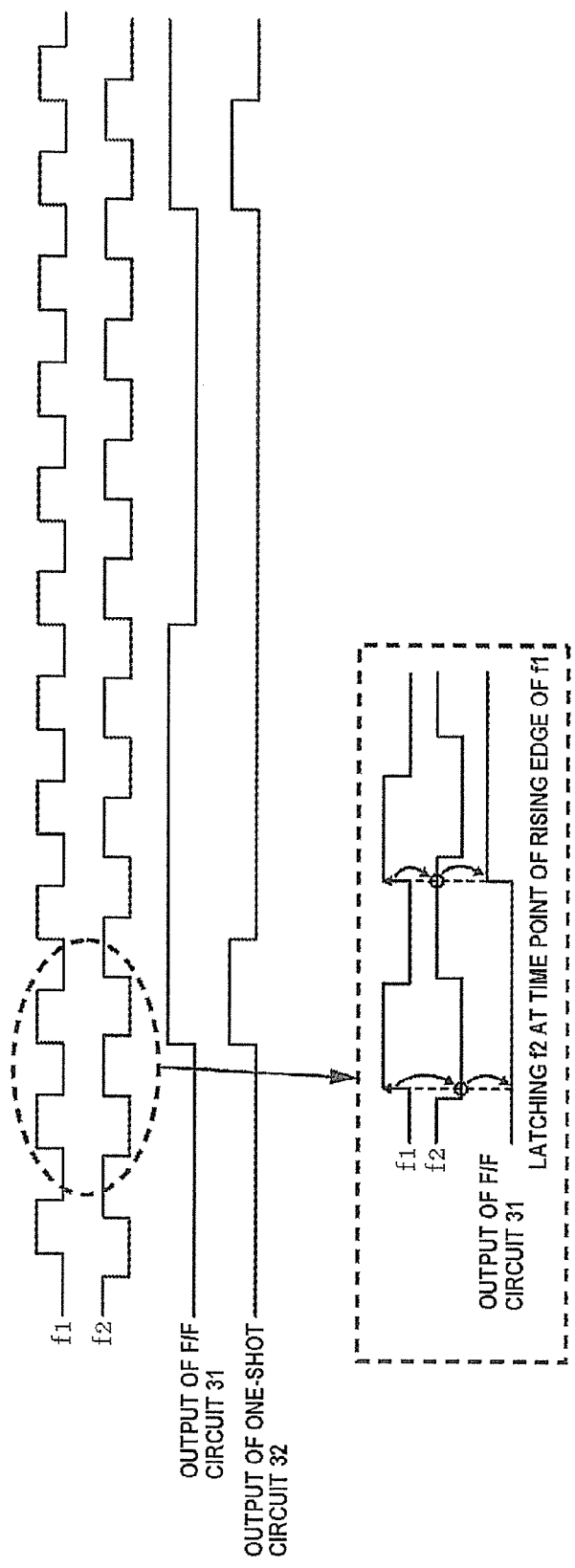
FIG. 3 is a waveform diagram of a partial output illustrated in FIG. 2.

A one-shot circuit 32 is disposed in a position after the flip-flop circuit 31. The one-shot circuit 32 outputs a one-shot pulse on the rising edge of the pulse signal obtained from the flip-flop circuit 31. FIG. 3 is a timing chart illustrating a sequence of signals up to now. PLL is disposed in a position after the one-shot circuit 32. This PLL includes a latch circuit 33, a loop filter 34 with an integration function, an addition unit 35, and a DDS circuit unit 36. The latch circuit 33 latches a sawtooth wave output from the DDS circuit unit 36 with a pulse output from the one-shot circuit 32. An output from the latch circuit 33 is a signal level of the sawtooth wave at a time point of the pulse output. The loop filter 34 integrates a DC voltage of this signal level. The addition unit 35 adds this DC voltage to a DC voltage corresponding to Δfr (the difference between f1 and f2 at the reference temperature, for example, 25° C.).

The DDS circuit unit 36 receives a voltage, which is a DC voltage operated by the addition unit 35, that is, a voltage where an output voltage of the loop filter 34 is subtracted from a DC voltage corresponding to Δfr. The sawtooth wave of a frequency corresponding to this voltage value is output. For easy understanding of the operation of the PLL, FIG. 4(a) to FIG. 4(c) very schematically illustrate a state of an output from each portion, and a very schematic description will be provided for intuitive grasp. At a time point of powering on the apparatus, a DC voltage corresponding to Δfr is input to the DDS circuit unit 36 through the addition unit 35. For example, assume that Δfr is 5 MHz, a sawtooth wave of a frequency corresponding to this frequency is output from the DDS circuit unit 36.

The sawtooth wave is latched at a pulse of a frequency corresponding to (f2−f1) with the latch circuit 33. Assuming that (f2−f1) is, for example, 6 MHz, since a period of a pulse for the latch is shorter than a period of the sawtooth wave, the latch point of the sawtooth wave gradually decreases as illustrated in FIG. 4(a). An output from the latch circuit 33 and an output from the loop filter 34 are, as illustrated in FIG. 4(b) and FIG. 4(c), gradually decreasing to the minus side. Since the sign of the output side of the loop filter 34 in the addition unit 35 is "−", a DC voltage input from the addition unit 35 to the DDS circuit unit 36 increases. Accordingly, the frequency of the sawtooth wave output from the DDS circuit unit 36 becomes high. When a DC voltage corresponding to 6 MHz is input to the DDS circuit unit 36, the frequency of the sawtooth wave becomes 6 MHz, and the PLL is locked as illustrated in FIG. 5(a) to FIG. 5(c). Here, a DC voltage output from the loop filter 34 is a value corresponding to Δfr−(f2−f1)=−1 MHz. That is, an integral value of the loop filter 34 can be a value corresponding to an integral value of a variation amount of 1 MHz when the sawtooth wave changes from 5 MHz to 6 MHz.

Contrary to this example, in the case where Δfr is 6 MHz and (f2−f1) is 5 MHz, since the period of the pulse for the latch is longer than that of the sawtooth wave, the latch point illustrated in FIG. 4(a) gradually increases. Accordingly, an output of the latch circuit 33 and an output of the loop filter 34 also increase. Therefore, a value subtracted by the addition unit 35 becomes large. This causes gradual decrease in the frequency of the sawtooth wave, eventually, when the frequency becomes 5 MHz, which is equal to (f2−f1), the PLL is locked. Then, a DC voltage output from the loop filter 34 is a value corresponding to Δfr−(f2−f1)=1 MHz.

Meanwhile, as described above, the actual output from the frequency difference detector 3 is, that is, an output from an averaging circuit 37 illustrated in FIG. 2, a value where a {(f2−f1)/f1}−{(f2r−f1r)/f1r} value is expressed in a 34-bit digital value. Assume that the collection of this value from near −50° C. to near 100° C. is (f1−f1r)/f1=OSC1 (the unit is ppm or ppb) and (f2−f2r)/f2r=OSC2 (the unit is ppm or ppb), a variation relative to temperature forms practically the same curve as OSC2−OSC1. Accordingly, an output from the frequency difference detector 3 can be treated as OSC2−OSC1=temperature data.

A latch operation of f2 by f1 in the flip-flop circuit 31 is asynchronous. Hence, an indefinite period such as a metastable state (when input data is latched at a time point of an edge of a clock, the input data needs to be held for a certain period of time before and after the edge at the time point of the latch. The metastable is a state where an output is destabilized by changing the clock and the input data approximately simultaneously.) may occur. There is a possibility that an instantaneous error is included in an output from the loop filter 34. Therefore, the averaging circuit 37, which is a circuit obtaining a moving average of an input value at a preliminarily set time, is disposed at an output side of the loop filter 34 to remove the instantaneous error if the error even occurs.

Figure 6:
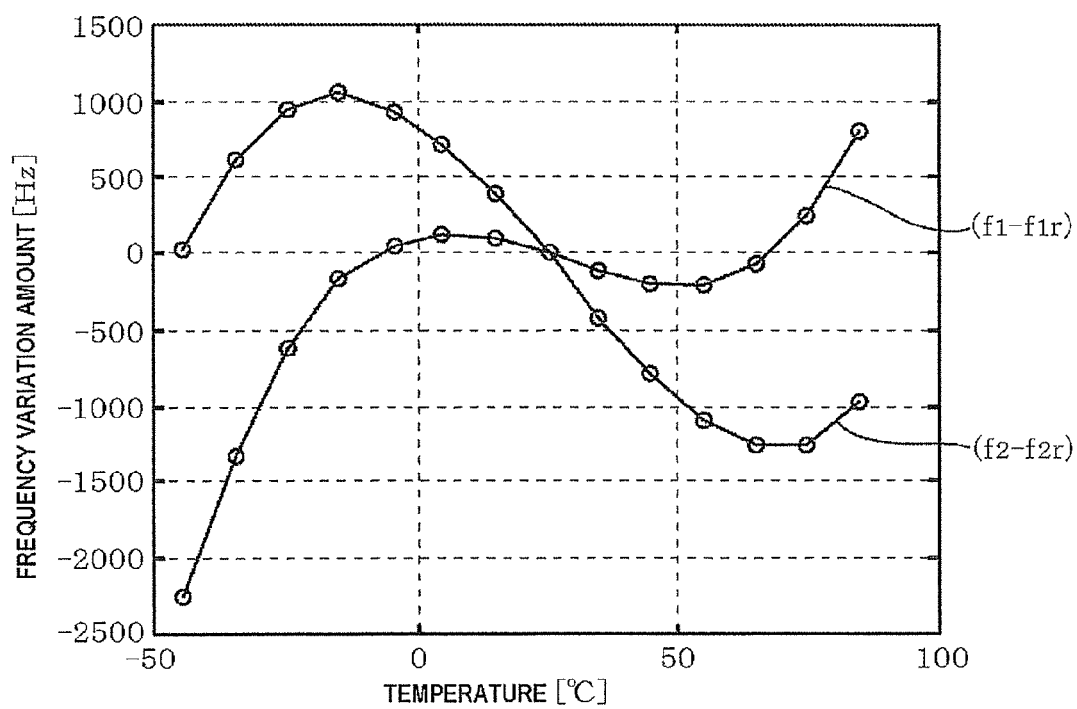
FIG. 6 is a frequency versus temperature characteristic graph illustrating a relationship between a frequency f1 of a first oscillator circuit or a frequency f2 of a second oscillator circuit and temperature.

Here, a description will be given of OSC2−OSC1, which is frequency deviation information of a temperature variation amount obtained at the loop filter 34 of the PLL, with reference to FIG. 6 to FIG. 8. FIG. 6 is a characteristic diagram illustrating a relationship between temperature and a frequency where f1 and f2 are normalized by the reference temperature. Here, "normalized" means the following. A reference temperature is set, for example, at 25° C. In the relationship between temperature and a frequency, a frequency at the reference temperature is regarded as zero. Finally, the relationship between an amount of deviation of a frequency from the frequency at the reference temperature and temperature is obtained. Assume that a frequency of the first oscillator circuit 1 at 25° C. is f1r, and a frequency of the second oscillator circuit 2 at 25° C. is f2r. The vertical axis values in FIG. 7 is (f1−f1r) and (f2−f2r).

Figure 7:
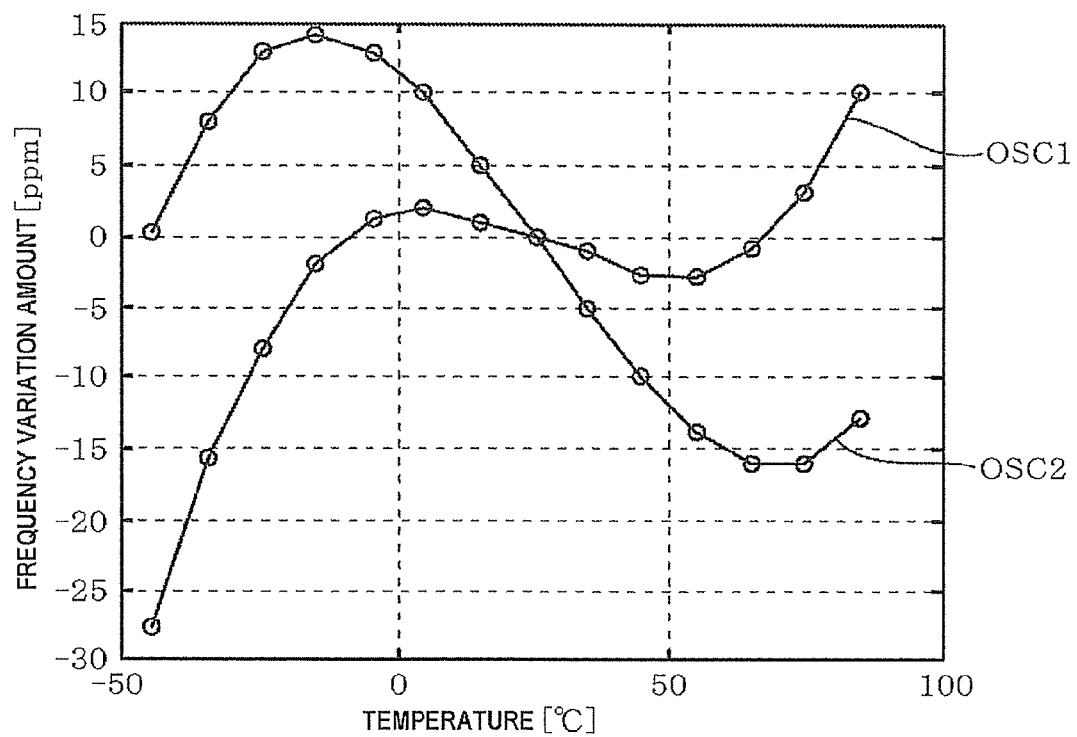
FIG. 7 is a frequency versus temperature characteristic graph illustrating a relationship between values of f1 or f2, which are each normalized, and temperature.
Figure 8:
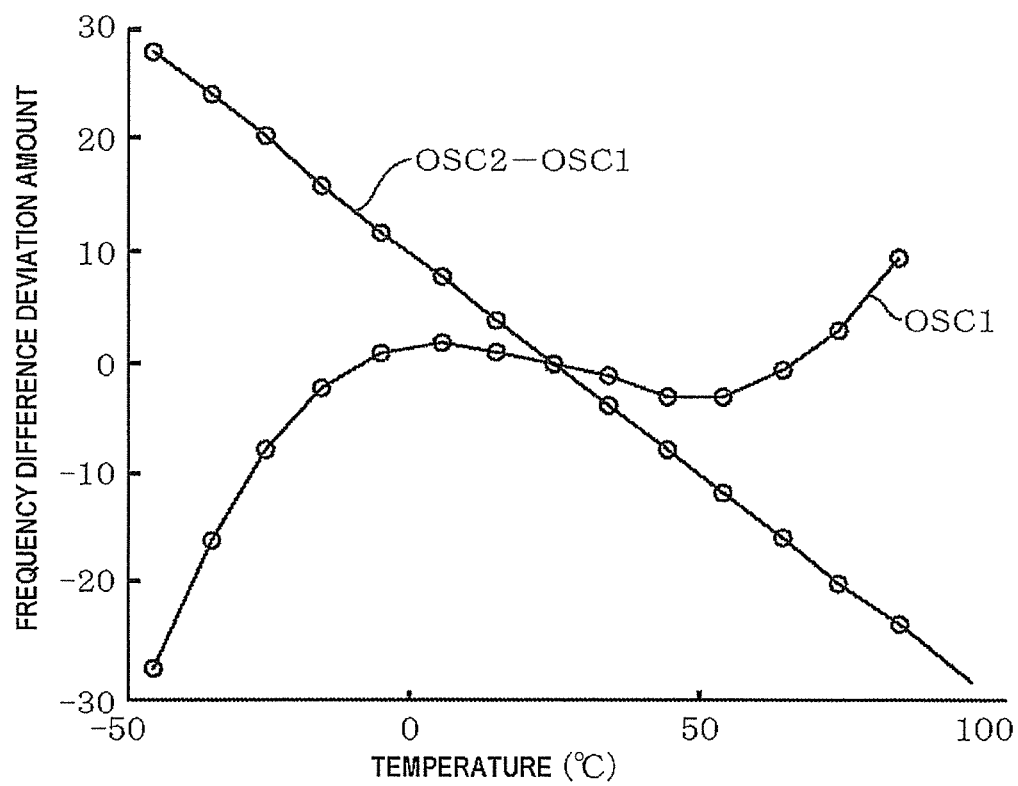
FIG. 8 is a frequency versus temperature characteristic graph illustrating relationships between a normalized f1 value and temperature, and between a difference ΔF, which is a difference between a normalized f1 value and a normalized f2 value, and temperature.

FIG. 7 illustrates a variation rate of a frequency at each temperature illustrated in FIG. 6 relative to a frequency at the reference temperature (25° C.). Accordingly, the vertical axis values in FIG. 7 are (f1−f1r)/f1r and (f2−f2r)/f2r (unit: ppm), that is, as described above, OSC1 and OSC2. FIG. 8 illustrates the relationship between OSC1 and temperature and the relationship between (OSC2−OSC1) and temperature. It can be seen that (OSC2−OSC1) forms a straight line relative to temperature. Accordingly, it can be seen that (OSC2−OSC1) corresponds to an amount of deviation of temperature variation from the reference temperature.

Now returning to FIG. 1, an output value of the frequency difference detector 3 is practically (OSC2−OSC1), and this value can be a temperature detection value of atmosphere around the crystal units 10 and 20. Then, an addition unit (a deviation amount extraction circuit) 51 is disposed in a position after the frequency difference detector 3. A difference between a temperature setting value, which is a digital signal (a 34-bit digital value of OSC2−OSC1 at set temperature), and OSC2−OSC1, which is an output from the frequency difference detector 3, is retrieved. As the temperature setting value, to suppress variation of the OSC1 value due to temperature change, for example, in the curve of the relationship between the OSC1 and the temperature illustrated in FIG. 8, for example, 50° C., which corresponds to a bottom part of the curve, is selected.

A heater control circuit 52 is disposed in a position after the addition unit 51. The heater control circuit 52 converts a digital signal output from the addition unit 51 into a corresponding DC voltage and supplies the voltage to the heater circuit 50. The heater circuit 50 includes a thermal resistance and generates heat corresponding to the supplied DC voltage. That is, the heat generation temperature of the heater circuit 50 is controlled according to a difference between the above-described temperature data and the temperature setting value. FIG. 1 illustrates the frequency difference detector 3, a correction value operator 4, the addition unit 51, and the heater control circuit 52 as a signal processing unit 5.

Additionally, as described above, the oscillator 1A performs temperature compensation of the reference clock to be input to the control circuit unit 200. The frequency deviation information of the temperature variation amount obtained at the loop filter 34 in the PLL is input to the correction value operator 4 illustrated in FIG. 1, and a correction value of the frequency is carried out in the correction value operator 4. As illustrated in FIG. 8, (OSC2−OSC1) has a linear relationship with temperature and corresponds to the amount of deviation of temperature variation from the reference temperature. Generally, obtaining the relationship between a frequency correction value, which offsets the amount of frequency variation due to frequency versus temperature characteristic of the crystal unit, and (OSC2−OSC1) finds the frequency correction value based on a detected value of (OSC2−OSC1).

Figure 9:
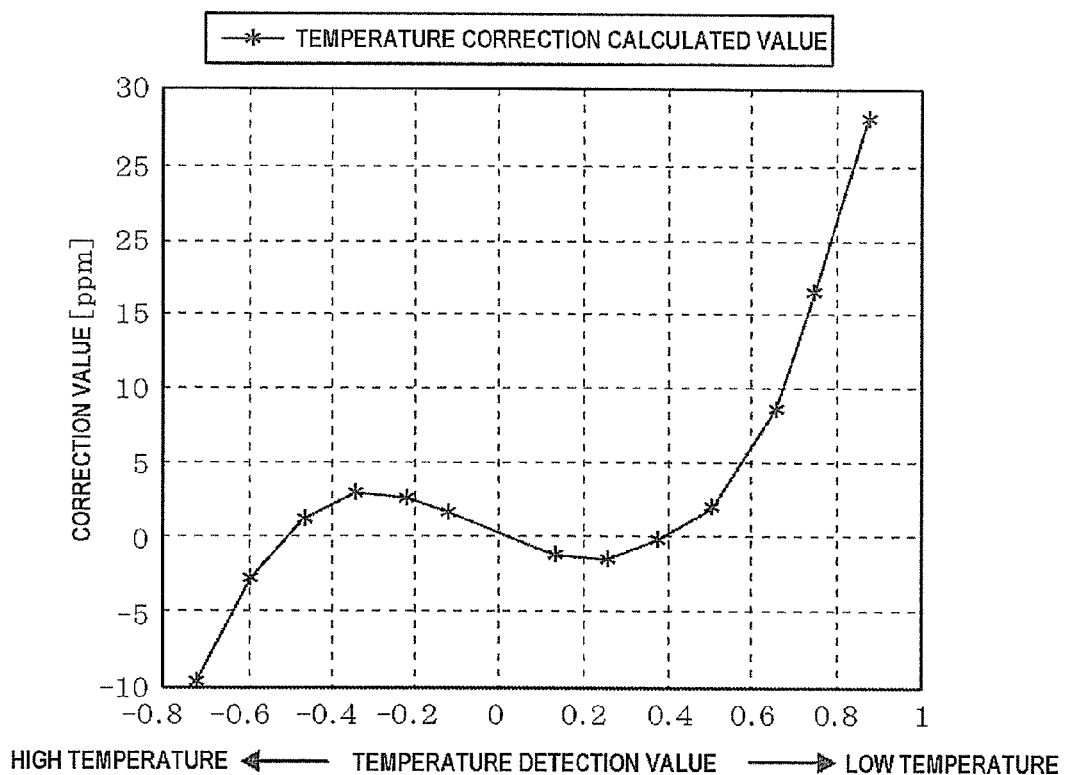
FIG. 9 is a characteristic diagram illustrating a relationship between normalized values in the vertical axis of FIG. 8 and a frequency correction value.

The oscillator 1A according to this embodiment, as described above, employs a frequency signal (f1), which is obtained from the first oscillator circuit 1, as a reference clock of the control circuit unit 200 illustrated in FIG. 1. Since this reference clock has a frequency versus temperature characteristic, temperature correction is to be performed with respect to the frequency of the reference clock. Hence, first, a function indicating the relationship between temperature and f1 normalized at the reference temperature is preliminary obtained. Also, a function to offset the frequency variation amount of f1 of this function is preliminary obtained as illustrated in FIG. 9. More specifically, the function f1 indicates a variation rate of a frequency at the reference temperature (f1−f1r)/f1r=OSC1. Accordingly, the vertical axis in FIG. 9 represents −OSC1 values. The horizontal axis in FIG. 9 is normalized by OSC2−OSC1 values. In this example, the values are normalized such that (OSC2−OSC1) is treated as +1 at −30 ppm and as −1 at +30 ppm. In the explanation of FIG. 7 to FIG. 9 according to the above-described embodiment, the frequency variation amount is expressed in "ppm" units. However, the amount is all treated as a binary number in the actual digital circuit. Therefore, frequency setting accuracy of the DDS circuit unit 36 is calculated in the structured bit number, for example, 34 bits.

The frequency characteristic of the crystal unit relative to temperature is treated as a ninth-order polynomial approximation formula in this example. The correction value operator 4 performs an arithmetic process of the formula (1) using these polynomial approximation formula coefficients.

$$Y=P1X^9+P2X^8+P3X^7+P4X^6+P5X^5+P6X^4+P7X^3+P8X^2+P9X \quad (1)$$

Figure 10:
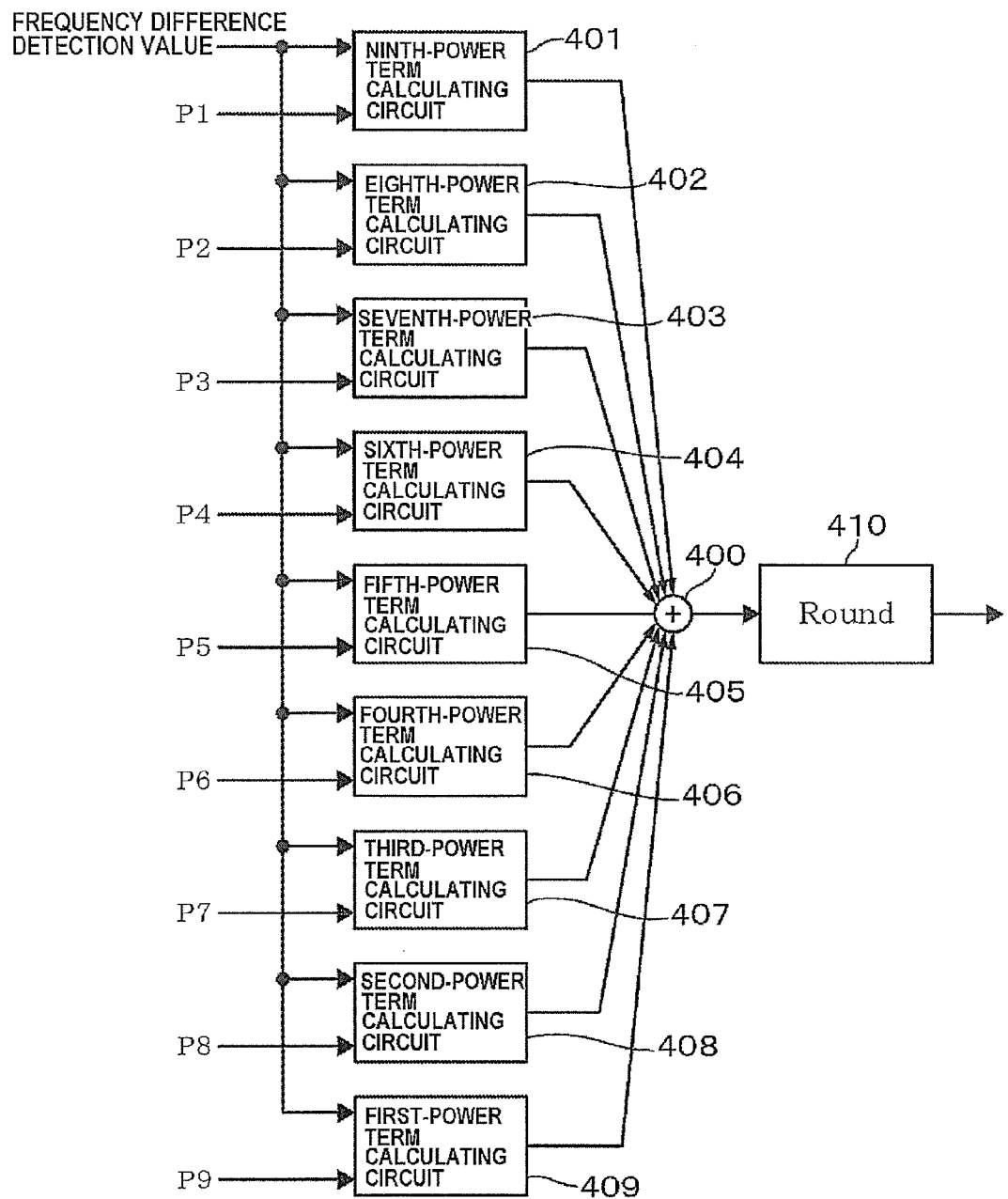
FIG. 10 is a block diagram illustrating a correction value operator.

In the formula (1), X represents frequency difference detection information, Y represents correction data, P1 to P9 represent polynomial approximation formula coefficients. Here, X is a value obtained by the frequency difference detector 3 illustrated in FIG. 1, that is, a value (OSC2−OSC1) obtained at the averaging circuit 37 illustrated in FIG. 2. FIG. 10 is a block diagram of the correction value operator 4. In FIG. 10, reference numerals 401 to 409 denote operators performing an operation of each term of the formula (1), reference numeral 400 denotes an addition unit, and reference numeral 410 denotes a circuit to perform rounding process.

Next, an operation of the oscillator 1A during normal operation is summarized. Focusing on the crystal controlled oscillator of this oscillator 1A, an output from the crystal controlled oscillator corresponds to a frequency signal output from the first oscillator circuit 1. The heater circuit 50 heats the atmosphere around the crystal units 10 and 20 to be at the set temperature. The first crystal unit 10 and the first oscillator circuit 1 generate a frequency signal, which is an output of the crystal controlled oscillator. The first crystal unit 10 and the first oscillator circuit 1 also serve a role as a temperature detector together with the second crystal unit 20 and the second oscillator circuit 2. The OSC2−OSC1 value corresponding to a frequency difference between frequency signals obtained from each of these oscillator circuits 1 and 2 corresponds to temperature as described above. A difference from the temperature setting value is retrieved by the addition unit 51.

This difference is converted into a DC voltage, and a control electric power of the heater circuit 50 is adjusted. For example, assume that a OSC1 value at 50° C. is −1.5×10⁵. If the temperature is lower than 50° C., an output from the addition unit 51 is a positive value and gradually increases as the temperature decreases. Accordingly, an increase to the control electric power of the heater circuit 50 is applied as the atmosphere temperature around the crystal units 10 and 20 becomes lower than 50° C. If the atmosphere temperature is higher than 50° C., the output becomes a negative value, and the absolute value increases as temperature increases. Accordingly, a decrease of supplied electric power to the heater is applied as the temperature becomes higher than 50° C. The atmosphere temperature around the crystal units 10 and 20 is attempted to be maintained at 50° C., which is the set temperature. Therefore, an output frequency from the first oscillator circuit 1, which is an oscillation output, is stabilized. As a result, in the control circuit unit 200 where an output from the first oscillator circuit 1 is employed as a clock signal, a frequency of a reference signal to be supplied to the phase frequency comparator 205 is stabilized. The output frequency from the voltage control oscillator 100, which is an output from the oscillator 1A (the frequency synthesizer), is also stabilized.

On the other hand, an output (OSC2−OSC1) from the frequency difference detector 3 is input to the correction value operator 4. The operation of the above-described formula (1) is performed, and the frequency correction amount of temperature correction data is obtained. The operation of the formula (1) is, in the characteristic diagram illustrated in FIG. 9, a process, which obtains vertical axis values of the correction frequency curved line corresponding to a value obtained based on an output value of the frequency difference detector 3.

The first crystal unit 10 and the second crystal unit 20 are constituted with the common crystal element Xb. The frequency difference between the oscillator circuits 1 and 2 is a value accurately corresponding to environmental temperature. Accordingly, an output from the frequency difference detector 3 is temperature difference information between the environmental temperature and the reference temperature (25° C. in this example). The frequency signal f1 output from the first oscillator circuit 1 is employed as a main clock of the control circuit unit 200. The correction value obtained at the correction value operator 4 is employed as a signal that compensates an operation of the control circuit unit 200 to offset an influence to the operation of the control circuit unit 200 based on frequency deviation amount of f1 due to deviation of the temperature from 25° C.

Meanwhile, the above is described such that the frequency signal f1 and a signal corresponding to a temperature correction value obtained at the correction value operator 4 are added and input to the control circuit unit 200. Actually, as described above, the frequency signal f1, a signal output from a microcontroller 7 that constitutes the oscillator 1A, and a signal corresponding to the above-described temperature correction value are added by an addition unit 71 illustrated in FIG. 1, and the added value is output to the control circuit unit 200. The oscillator 1A is constituted such that an output frequency of the oscillator 1A is variable relative to a nominal frequency, which is determined by the supplier side, by changing a correction output signal from the microcontroller 7 to the addition unit 71 with an external computer 60.

The microcontroller 7 serves a role that transmits information unique to each oscillator. The information includes a correction output signal for frequency variation to the above-described addition unit 71, the coefficients P1 to P9, a voltage signal corresponding to the above-described Δfr, a temperature setting value to be output to the addition unit 51, and similar information. Assume that a mode that retrieves a desired oscillation output from the voltage control oscillator 100 as described above is referred to as a normal operation mode of the oscillator 1A. The oscillator 1A switches and performs the normal operation mode and a frequency measurement mode, which does not aim to retrieve an oscillation output like the normal operation mode and externally retrieves f1 and f2 for measurement. This frequency measurement mode is, for example, performed to set the above-described coefficients P1 to P9, and the microcontroller 7 also serves a role of controlling switching of these modes.

A description will be given of the constitution of the microcontroller 7 with reference to FIG. 11. Reference numeral 72 denotes a first register corresponding to a frequency adjustment amount output unit. A first register 72 serves a role, for example, of setting a frequency adjustment amount with a 24-bit digital value expressed in two's complement. This frequency adjustment amount is to set a ratio relative to the nominal frequency within a variable width set at the supplier side by the user. When this frequency adjustment amount is determined, a signal corresponding to a value where a frequency according to the above-described ratio is added to the frequency f1 corrected by the above-described correction value operator 4 is output from the addition unit 71 to the control circuit unit 200. Additionally, the microcontroller 7 includes a second register 73 and a third register 74. Reference numerals 75 and 76 denote the respective multiplication units. Reference numeral 70 in FIG. 11 denotes a bus. A first gain G1 and a second gain G2, which are respectively stored to the registers 73 and 74, are multiplied by a frequency adjustment amount set by the first register 72. The above-described frequency adjustment amount×G1×G2 value varies. Accordingly, an output to the addition unit 71 changes, and then the oscillation frequency changes. The first gain G1 is, for example, expressed as an 8-bit digital value expressed in two's complement. The second gain G2 is a value for performing a rounding process (a process where $2^{-n}$ is multiplied (n represents a natural number)) with respect to a value where the first gain G1 is multiplied by the above-described frequency adjustment amount. By changing the frequency adjustment amount from the minimum value to the maximum value, each gain is set such that the frequency variable width changes from the supplier-defined minimum value to the supplier-defined maximum value.

The microcontroller 7 includes a fourth register 77 that switches the above-described modes. As a logical value for mode switching, "0" or "1" is written to this fourth register 77, and switching of the switch of a connection switching unit 63 is controlled with the logical value. The microcontroller 7 includes a fifth register 78 that stores unique information of the oscillator 1A, such as the above-described coefficients P1 to P9, Δfr, and temperature setting value output to the addition unit 51. This unique information is respectively read out to the signal processing unit 5.

The microcontroller 7 includes a power-on reset circuit 79. This serves a role that initializes data of each above-described register and writes 0 when the power source of the oscillator 1A is turned on. The input terminal of this power source is denoted as reference numeral 61 in FIG. 11. Reference numeral 62 denotes a switch that switches on and off the power source. Additionally, the microcontroller 7 includes an interface circuit 81 for communications with the external computer 60 connected to the oscillator 1A.

A description will be given of an external constitution of the microcontroller 7. The oscillator 1A includes the connection switching unit 63, which includes switches 601 and 602. Then, assume that a signal path connecting the first oscillator circuit 1 and the signal processing unit 5 denoted by reference numeral 603, and a signal path connecting the second oscillator circuit 2 and the signal processing unit 5 denoted by reference numeral 604. Signal paths 605 and 606 are respectively connected to signal paths 603 and 604. The switch 601 connects a first connecting terminal 58 by switching between the above-described interface circuit 81 and the signal path 605. The switch 602 connects a second connecting terminal 59 by switching between the interface circuit 81 and the signal path 606. As described above, according to a logical value for switching to be written to the fourth register 77, the switching operation of the switches 601 and 602 is controlled. In the case where the above-described logical value is 0, the interface circuit 81 is connected to the first and second connecting terminals 58 and 59. In the case where the logical value is 1, the switches 601 and 602 are switched such that the signal paths 605 and 606 are connected to the first and second connecting terminals 58 and 59, respectively.

A description will be given of the external portion of the oscillator 1A. In this example, a connection switching tool 64 is disposed for quick switching between the frequency measurement mode and the normal operation mode. The above-described external computer 60 is connected to this connection switching tool 64 via an I2C bus. Additionally, a frequency counter 66, which is a frequency measuring unit, is connected to the connection switching tool 64 via a buffer circuit 65. The connection switching tool 64 includes switches 607 and 608. As described above, the first and second connecting terminals 58 and 59 are connected to the buffer circuit 65 and the external computer 60 while switched between them. Each of the switches 607 and 608 of the connection switching tool 64 is constituted so as to be switched by the external computer 60.

As described below, in execution of the normal operation mode, the external computer 60 is connected to the microcontroller 7, namely, the first to fifth registers. To rewrite data into these respective registers, each switch of the connection switching unit 63 and the connection switching tool 64 is switched. That is, during execution of this normal operation mode, the user can change the above-described nominal frequency by changing the frequency adjustment amount in the above-described first register 72 from the external computer 60. In execution of the frequency measurement mode, each of the above-described switches is switched such that the first oscillator circuit 1 and the second oscillator circuit 2 are connected to the frequency counter 66.

An external memory 82 of non-volatile memory, for example, EEPROM (Electrically Erasable Programmable ROM) is connected outside of the oscillator 1A. The external memory 82 stores each piece of unique information to be stored in the above-described first to third registers 72 to 74 and fifth register 78. When the power source is turned on, each piece of unique information is read into the corresponding respective registers with a program 83 in the microcontroller 7 for operation of the oscillator 1A. The external computer 60 can access this external memory 82 to set each piece of unique information.

Figure 12:
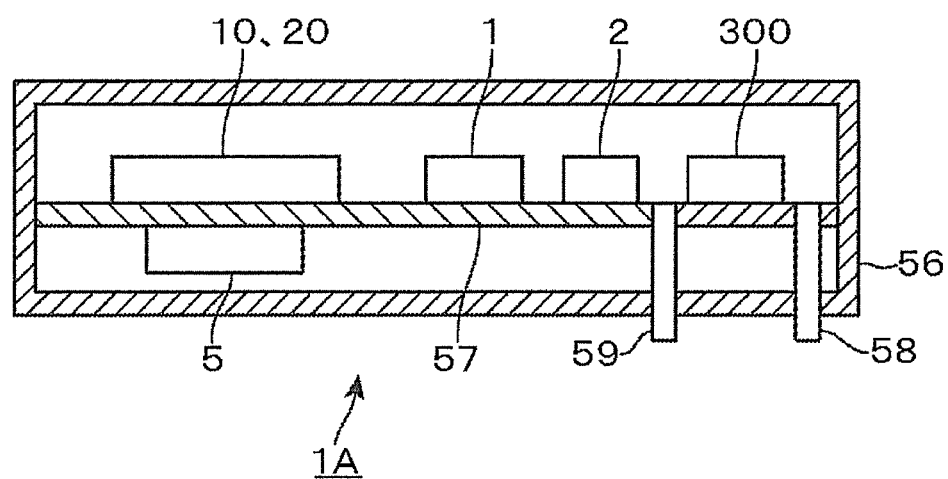
FIG. 12 is a schematic, longitudinal cross-sectional side view of the oscillator.

FIG. 12 is a longitudinal cross-sectional side view illustrating a schematic structure of the oscillator 1A illustrated in FIG. 1. Reference numeral 56 denotes a container, and reference numeral 57 denotes a printed circuit board disposed in a container 56. A printed circuit board 57 includes the crystal units 10 and 20, the oscillator circuits 1 and 2, and an integrated circuit unit 300 on its upper surface side. The integrated circuit unit 300 includes the signal processing unit 5, the control circuit unit 200, the microcontroller 7, and the connection switching tool 64. Additionally, the printed circuit board 57 includes the heater circuit 50 at a position, for example, facing the crystal units 10 and 20 on its lower surface side. The printed circuit board 57 includes the first connecting terminal 58 and the second connecting terminal 59 connected to the integrated circuit unit 300 via a wiring (not shown) formed on the printed circuit board 57. These connecting terminals 58 and 59 have distal ends that are projected outside of the container 56, and are connected to the frequency counter 66 or the external computer 60 via the above-described connection switching tool 64.

Figure 15:
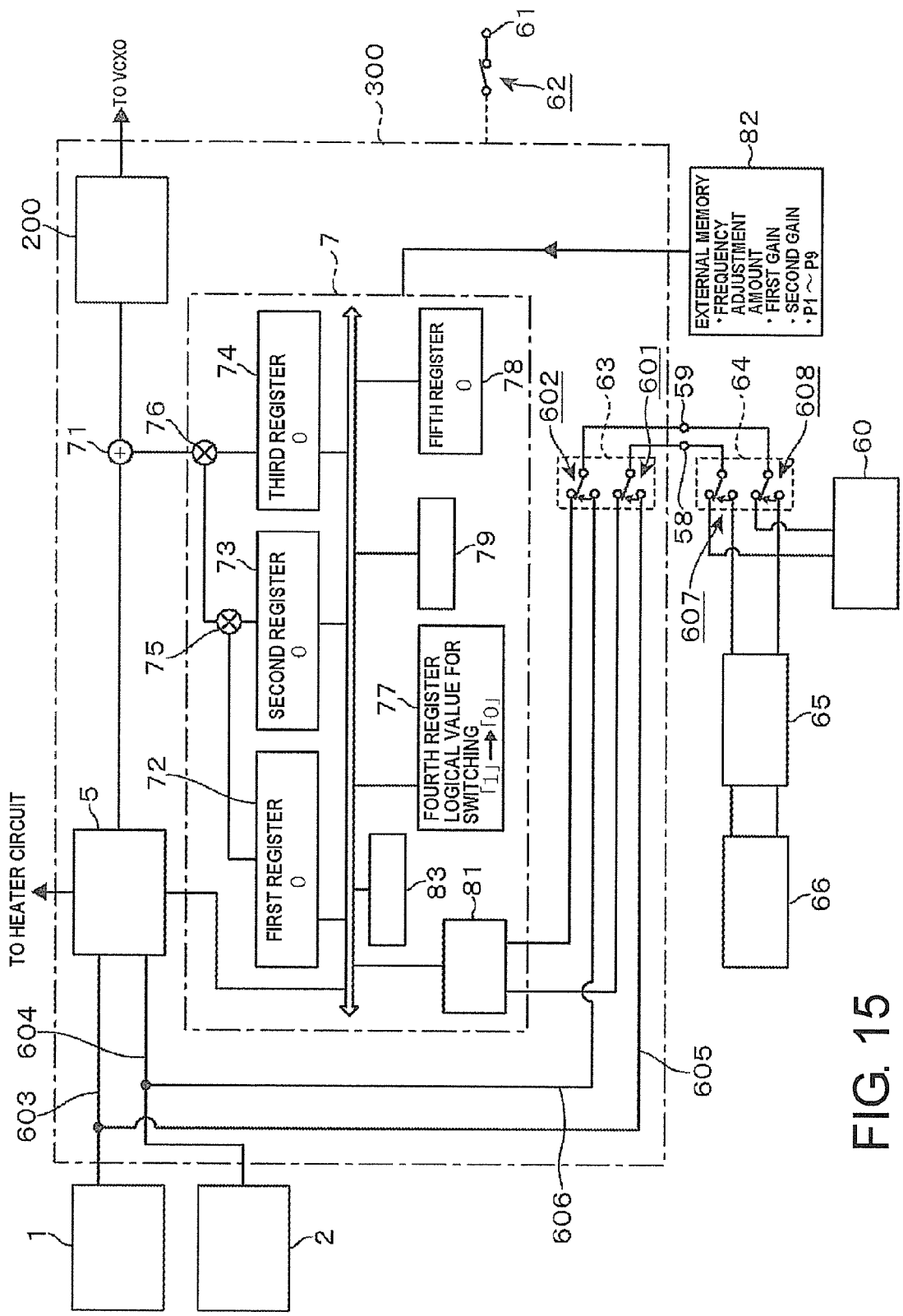
FIG. 15 is an operation diagram of a switch action during the switching operation.
Figure 16:
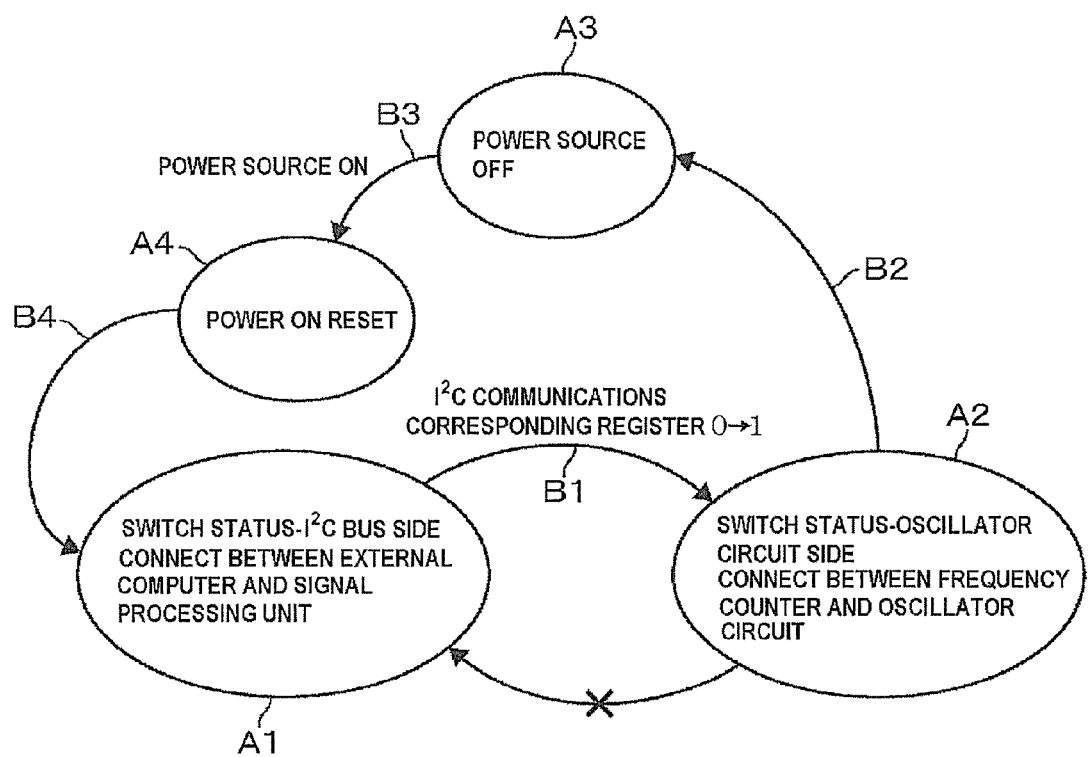
FIG. 16 is an operation diagram of a switch action during the switching operation.

Subsequently, a procedure of switching between the normal operation mode and the frequency measurement mode by switching of each switch of the oscillator 1A will be described by referring to the above-described FIG. 11 and FIG. 13 to FIG. 15, which illustrate switch states. In this example, this switching is performed to set the coefficients P1 to P9 during fabrication of the oscillator 1A. FIG. 16 schematically illustrates the switching of the modes. The procedure will also be described by referring to this FIG. 16 accordingly.

Figure 11:
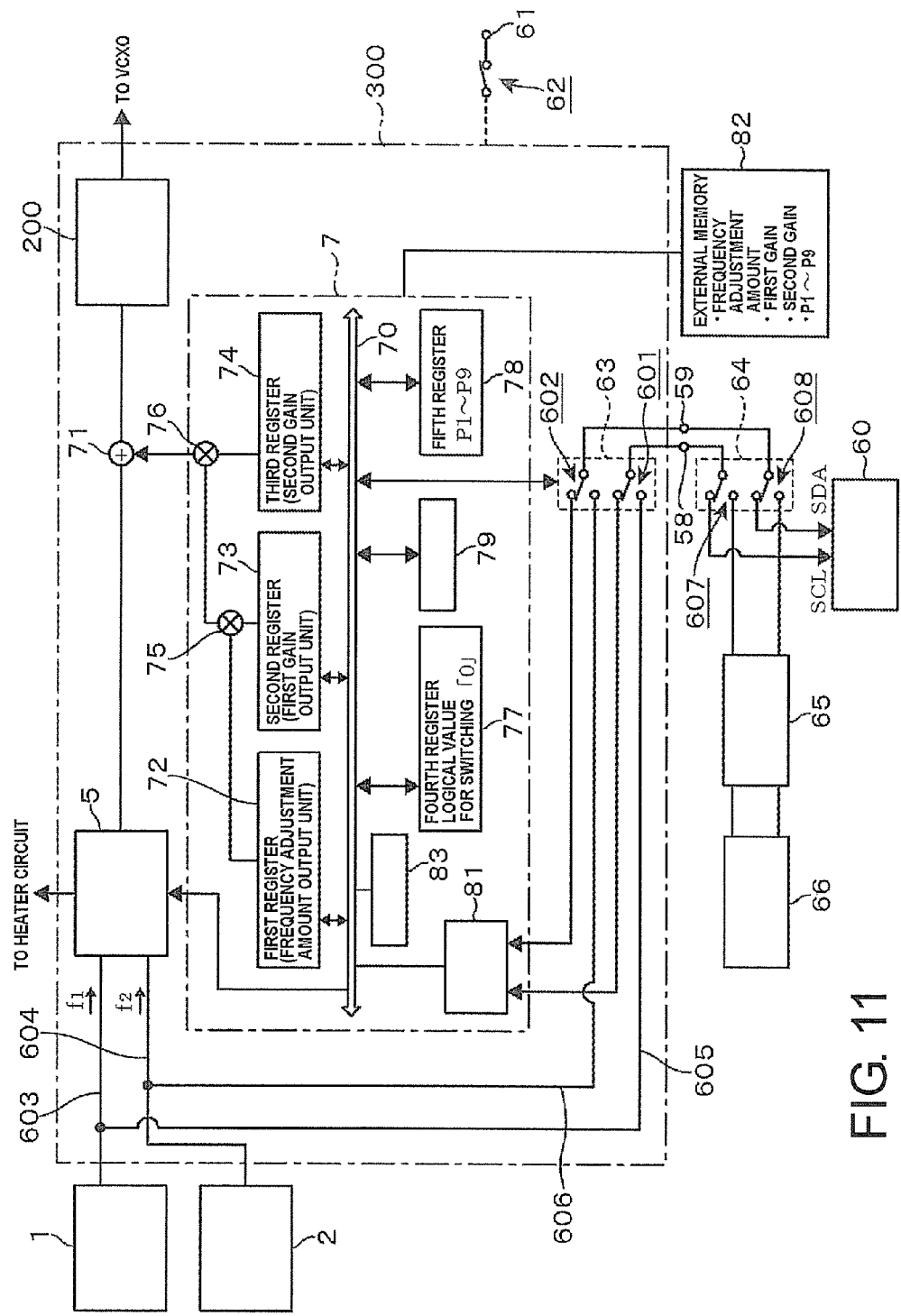
FIG. 11 is a block diagram of a microcontroller that constitutes the oscillator.

FIG. 11 illustrates the oscillator 1A during operation in the normal operation mode. The oscillator 1A is in a state corresponding to A1 in FIG. 16. In a state of this FIG. 11, the first connecting terminal 58 and the second connecting terminal 59 are connected to the external computer 60 via the I2C bus using each of the switches 607 and 608 of the connection switching tool 64. The fourth register 77 stores 0 as a logical value for switching. Accordingly, the switches 601, 602 of the connection switching unit 63 connect the first connecting terminal 58 and the second connecting terminal 59 to the interface circuit 81 that allows the external computer 60 to access the microcontroller 7. The first to the third registers 72 to 74 store the frequency adjustment amount, the first gain, and the second gain read from the external memory 82. Similarly, the fifth register 78 stores various unique information read from the external memory 82. However, regarding the coefficients P1 to P9, information unique to the apparatus has not yet been determined; therefore, for example, predetermined standard values have been set for the coefficients P1 to P9.

Figure 13:
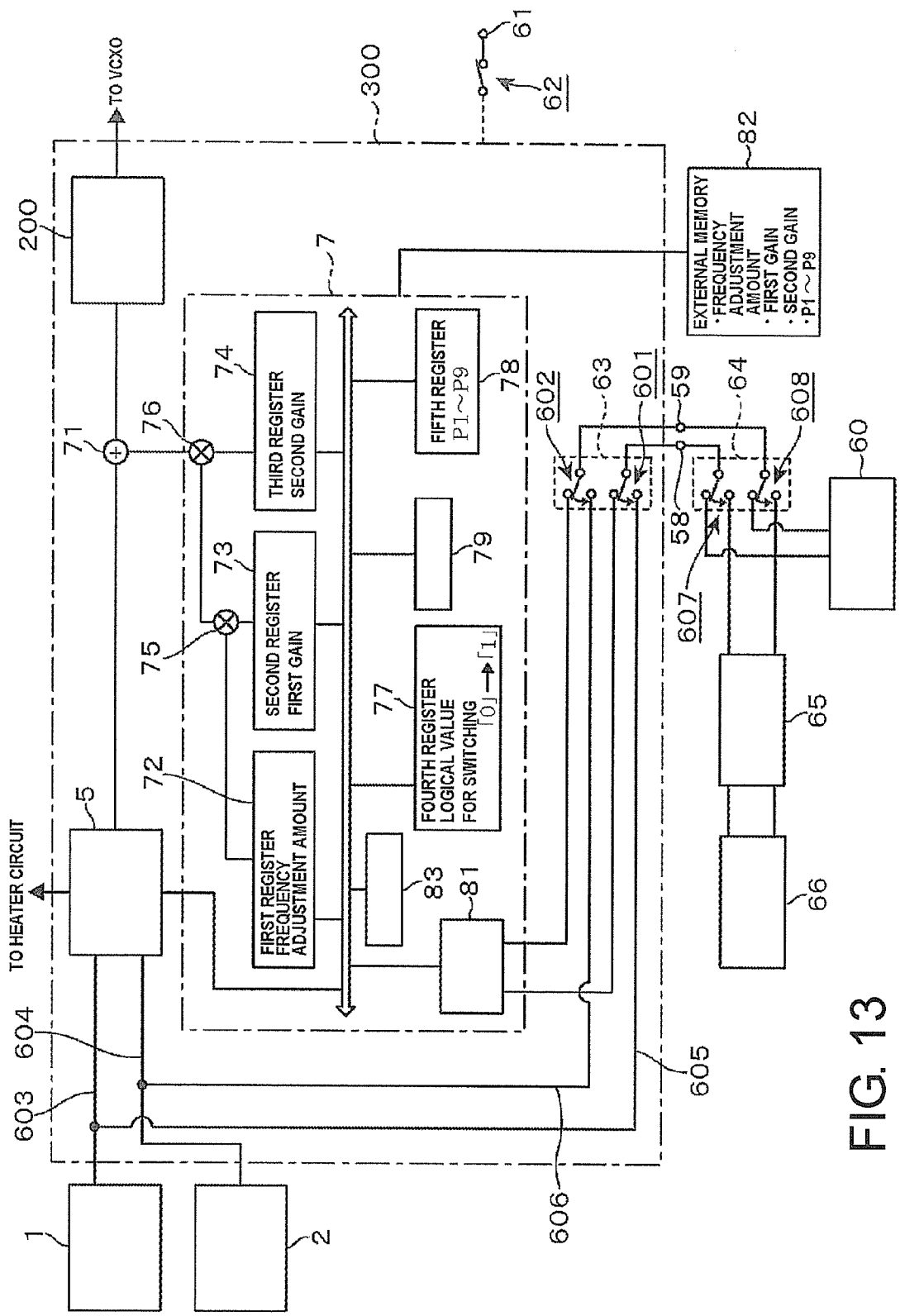
FIG. 13 is an operation diagram of a switch action during the switching operation.

For example, this oscillator 1A is stored in an oven where internal temperature is changeable. Then, as illustrated in FIG. 13, the user accesses the fourth register 77 from the external computer 60 and writes "1" as a logical value for switching (B1 in FIG. 16). Accordingly, this operation switches the switches 601 and 602 of the connection switching unit 63. This disconnects the first connecting terminal 58 and the second connecting terminal 59 from the microcontroller 7, and connects these connecting terminals 58 and 59 respectively to the signal paths 605 and 606 instead. This switching of the switches 601 and 602 terminates communications between the external computer 60 and the oscillator 1A on the I2C bus. For example, when the external computer 60 detects termination of the communications, the external computer 60 switches each of the switches 607 and 608 of the connection switching tool 64. Instead of detecting the termination of communications like this, the external computer 60 may switch the switches 607 and 608 when predetermined time is passed after writing the above-described logical value "1". Thus, switching of each of the switches 607 and 608 connects the first connecting terminal 58 and the second connecting terminal 59 to the frequency counter 66 instead of connecting to the external computer 60. Thus, the oscillator 1A transitions to the frequency measurement mode (A2 in FIG. 16).

Figure 14:
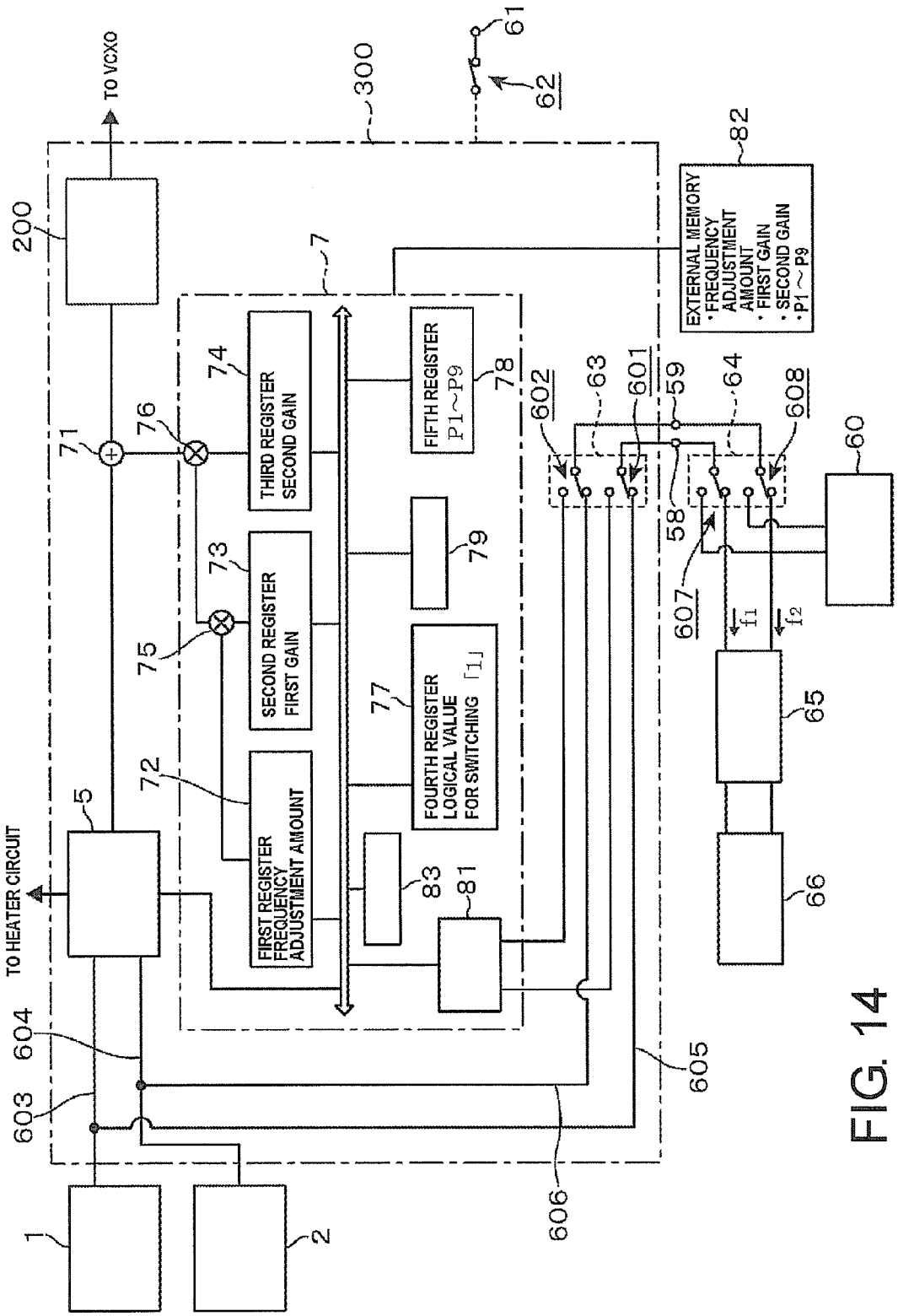
FIG. 14 is an operation diagram of a switch action during the switching operation.

As illustrated in FIG. 14, the output f1 of the first oscillator circuit 1 is output to the frequency counter 66 via the signal path 605, the first connecting terminal 58, and the buffer circuit 65 to measure the f1 by the frequency counter 66. The output f2 of the second oscillator circuit 2 is output to the frequency counter 66 via the signal path 606, the second connecting terminal 59, and the buffer circuit 65 to measure the f2. Then, temperature in the above-described oven is sequentially changed, f1 and f2 are measured at each temperature, and the relationship between (OSC2−OSC1) and temperature is obtained using the f1 and f2 measured at each temperature. To output the above-described nominal frequency from this measurement data, a frequency correction curve line illustrating the relationship between the temperature and −OSC1 for offsetting the frequency variation amount relative to the temperature, is found. Then, the least squares method is used to calculate the polynomial coefficients for the ninth-order term P1 to P9 of the approximation formula.

After calculation of P1 to P9, for example, the user operates a power source switch 62 of the apparatus, turns off the power source of the oscillator 1A (A3 and B2 in FIG. 16), and removes the oscillator 1A from the oven. Then, the user operates, for example, the external computer 60, and switches the switches 607 and 608 of the connection switching tool 64 such that the first connecting terminal 58 and the second connecting terminal 59 are connected to the external computer 60 instead of the frequency counter 66. Additionally, the P1 to P9 stored in the external memory 82 are rewritten to the calculated P1 to P9 by the external computer 60 through a signal path (not shown) connecting the external computer 60 and the external memory 82.

Afterwards, if the user operates the power source switch 62 of the apparatus to turn on the power source of the oscillator 1A (B3 in FIG. 16), the power-on reset circuit 79 initializes data in the first to fifth registers of the microcontroller 7 to "0". As described above, each piece of unique information is read from the external memory 82 and written to the corresponding respective registers. As illustrated in FIG. 15, changing the logical value for switching stored in the fourth register 77 to 0 switches the switches 601 and 602 of the connection switching unit 63. Instead of disconnecting the first connecting terminal 58 and the second connecting terminal 59 from the respective signal paths 605 and 606, the first connecting terminal 58 and the second connecting terminal 59 are connected to the interface circuit 81. Thus, the oscillator 1A returns to the A1 state in FIG. 16, namely, the normal operation mode. An oscillation output is obtained based on the changed P1 to P9. This allows the frequency adjustment by changing gains of each of registers 73 and 74 with the external computer 60 (A4 and B4 in FIG. 16).

As illustrated in FIG. 16, upon execution of the frequency measurement mode, the external computer 60 and the microcontroller 7 are disconnected. For transition from the frequency measurement mode to the normal operation mode, as described above, it is required to turn off the power source of the oscillator 1A once. Although not shown, if the power source is turned off in the normal operation mode, since the logical value in the fourth register 77 remains 0 at the time points before and after turning on the power source again. Hence, the switches 601 and 602 hold the connection of the connecting terminals 58 and 59 to the interface circuit 81.

When the P1 to P9 are thus set, and fabrication of the oscillator 1A is completed and then is shipped, the buffer circuit 65, the frequency counter 66, and the connection switching tool 64 are no longer required and therefore removed from the oscillator 1A. For use of the oscillator 1A, for example, the external computer 60 is connected to the connecting terminals 58 and 59 without passing through the connection switching tool 64. To set the P1 to P9 again as described above, the buffer circuit 65, the frequency counter 66, and the connection switching tool 64 are connected. For example, in execution of the frequency measurement mode, a frequency counter 67 is connected to the connecting terminals 58 and 59, and in execution of the normal operation mode, the external computer 60 is connected to the connecting terminals 58 and 59. Thus, the connection destination of the connecting terminals 58 and 59 may be switched in every switching of the modes. That is, the modes may be switched without using the connection switching tool 64.

The power source switch 62 of the apparatus may be connected to the external computer 60 without passing through the connecting terminals 58 and 59 and may be switched between on and off from the external computer 60. Each switch of the connection switching tool 64 may be switched manually by the user instead of switching by the external computer 60.

With the oscillator 1A, the connection switching unit 63 switches between: a state where the connecting terminals 58 and 59 are connected to the microcontroller 7 for access from the external computer 60 to each register in the microcontroller 7; and a state where the first oscillator circuit 1 and the second oscillator circuit 2 are connected to the connecting terminals 58 and 59 to retrieve the oscillation frequencies f1 and f2 from the connecting terminals 58 and 59. When the fourth register 77 in the microcontroller 7 is initialized by a reset condition by turning on and off the power source, the oscillator 1A enters the initial state where the connecting terminals 58 and 59 connect to the microcontroller 7. This eliminates the need for disposing a dedicated terminal for retrieving the f1 and f2. Accordingly, this simplifies the constitution of the oscillator and reduces production cost of the oscillator.

Figure 17:
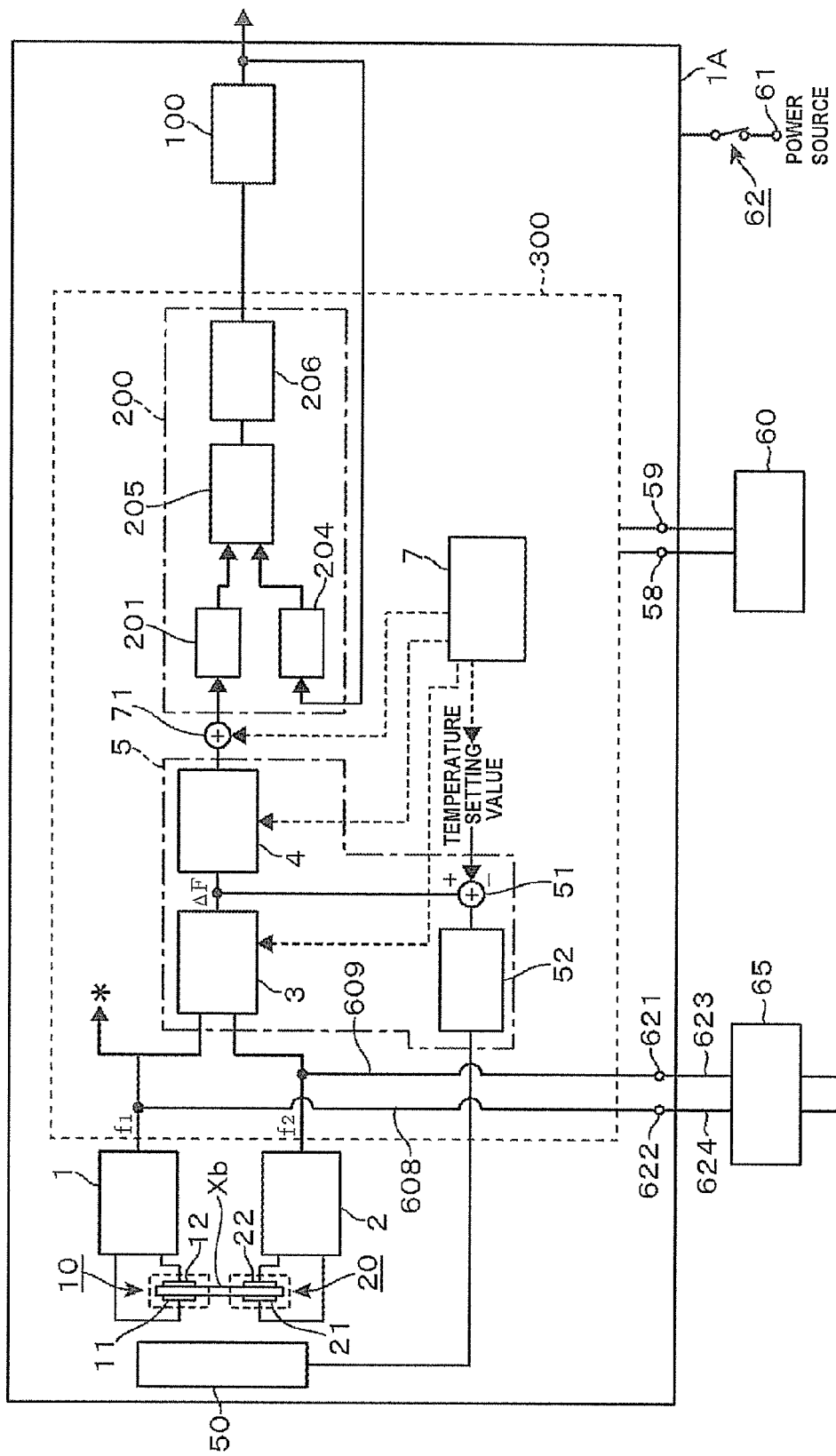
FIG. 17 is a block diagram illustrating the oscillator according to a comparative example.
Figure 18:
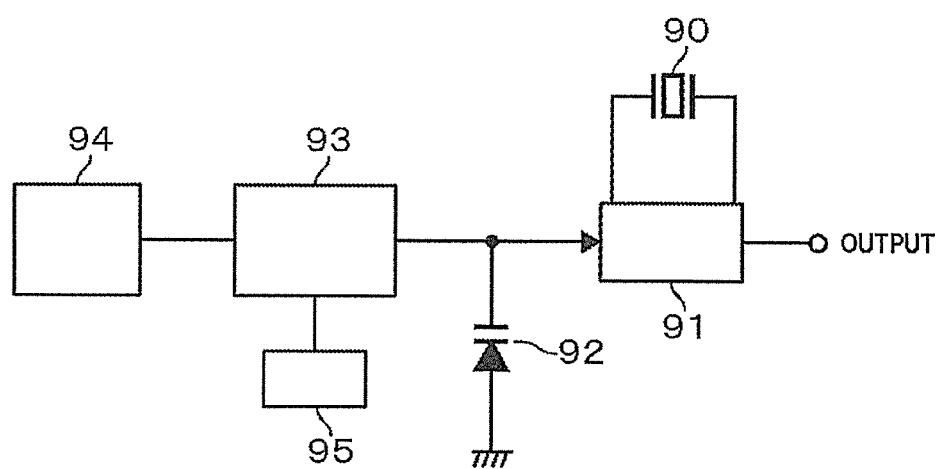
FIG. 18 is a circuit view of the conventional oscillator.

FIG. 17 illustrates another oscillator as a comparative example. The difference from the oscillator 1A is as follows. Terminals 621 and 622 different from the connecting terminals 58 and 59 are disposed and respectively connected to signal paths 605 and 606. The terminals 621 and 622 are connected to the buffer circuit 65 through jumper wires 623 and 624, which are conductive paths, and the frequencies f1 and f2 are retrieved by the frequency counter 67. However, as described above, providing the terminals 621 and 622 and the jumper wires 623 and 624 complicates the constitution of the oscillator and increases the number of fabrication processes. Additionally, since the jumper wires 623 and 624 are connected by soldering by a worker, this makes it difficult to increase the reliability of fabrication accuracy of the apparatus. Moreover, since heat transmits to the jumper wires 623 and 624 before and after measurement of the frequencies f1 and f2. This heat may change the f1 and f2 values. The above-described oscillator 1A can prevent such faults.

Meanwhile, the logical value for switching corresponding to the initial state of the fourth register 77 when the power source is turned on is not limited to "0". The following case is also included in the technical scope of the present disclosure. For example, after the power source of electronic equipment is turned on, turning on an operation switch writes the logical value "1" to the addition unit 71 by an internal device. Then, this logical value is treated as a logical value for execution of the normal operation mode.

While in the above-described description, an exemplary setting of the P1 to P9 is employed by the correction value operator 4, another piece of unique information can also be rewritten. For example, the following case is effective. Similarly to the case of setting P1 to P9, the temperature of the oven is varied, and the temperature changes of f1 and f2 are measured. Based on this measurement result, circuit constants of the heater circuit 50 and the heater control circuit 52 are set such that an output from the heater circuit 50 may be appropriate for each temperature. That is, the oscillator 1A may have a constitution where only either one of a correction value operated at the correction value operator 4 or ambient temperature adjusted at the heater circuit 50 is controlled, and the obtained oscillation frequency f1 is output to the control circuit unit 200. Further, a RAM (Random Access Memory) may be employed instead of the respective registers 72 to 74, 77, and 78, which are volatile memories and are storage units of the microcontroller 7. The reset circuit may have any configuration insofar as the reset circuit can reset the fourth register 77 separately from the external computer 60. For example, a constitution of the following circuit is possible. A manual switch connected to the microcontroller 7 is disposed. Operating the switch resets the logical value in the fourth register 77 without turning on and off the power source.

Additionally, if the manual switch is provided, the switch of the connection switching unit may be switched instead of using the logical value. Meanwhile, in normal operation, a description is given assuming that the external computer 60 is connected to the connecting terminals 58 and 59. However, the external computer 60 may be disconnected from the connecting terminals 58 and 59 after setting a value of each register. That is, the external computer 60 does not have to be connected at the time point of operation and may be connected to the connecting terminals 58 and 59 again when each piece of unique information in the register or the external memory 82 needs to be changed.

What is claimed is:

1. An oscillator for outputting f1 as an oscillation output by treating a differential signal corresponding to a difference between an oscillation output f1 of a first oscillator circuit and an oscillation output f2 of a second oscillator circuit as a temperature detection value, the oscillator outputting a control signal to suppress an influence caused by a temperature characteristic of f1 based on the differential signal, the oscillator comprising:
   a storage unit that stores a parameter to output the control signal;
   a signal processing unit connected to a first signal path and a second signal path to retrieve the respective f1 and f2, the signal processing unit obtaining the differential signal from the retrieved f1 and f2, the signal processing unit outputting the control signal based on the differential signal and the parameter;
   a first connecting end and a second connecting end to be connected to an external computer; and
   a switching unit switches between a first state and a second state, the first state being a state where the first connecting end and the second connecting end are connected to the storage unit for access from the external computer to the storage unit, the second state being a state where the first connecting end and the second connecting end are connected to the first signal path and the second signal path such that the respective f1 and f2 are retrieved from the first connecting end and the second connecting end to an external frequency measuring unit.

2. The oscillator according to claim 1, wherein
the switching unit switches between the first state and the second state based on a logical value stored in a storage area for switching a connection state provided in the memory, and
in the storage area for switching, one of a first logical value and a second logical value is selected and stored, wherein the first logical value being for placing the switching unit in the first state, the second logical value being for placing the switching unit in the second state, the oscillator further comprising:
a reset unit configured to reset the logical value in the storage area for switching to the first logical value, the reset unit being provided independently of the external computer.

3. The oscillator according to claim 2, wherein
the reset unit resets the logical value storage area to the first logical value when a power source of the oscillator is turned on.

4. The oscillator according to claim 1, wherein
a control signal to suppress an influence caused by the temperature characteristic of the f1 is a signal corresponding to a frequency correction value relative to the f1 at a reference temperature, the control signal being based on a relationship between a variation amount from a value of the f1 at the reference temperature of the f1 and a signal corresponding to a difference between the f1 and the f2.

5. The oscillator according to claim 1, further comprising:
a heat regulation unit configured to maintain a constant temperature of a first crystal unit and a second crystal unit, the first crystal unit and the second crystal unit being connected to the first oscillator circuit and the second oscillator circuit, wherein
a control signal to suppress an influence caused by a temperature characteristic of the f1 is a signal for controlling an amount of heat generated by the heat regulation unit.

* * * * *